(12) United States Patent
Karpov

(10) Patent No.: US 7,811,885 B2
(45) Date of Patent: Oct. 12, 2010

(54) METHOD FOR FORMING A PHASE CHANGE DEVICE

(75) Inventor: Ilya V. Karpov, Santa Clara, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 165 days.

(21) Appl. No.: 11/725,434

(22) Filed: Mar. 19, 2007

(65) Prior Publication Data

US 2007/0187663 A1   Aug. 16, 2007

Related U.S. Application Data

(62) Division of application No. 10/634,139, filed on Aug. 4, 2003, now Pat. No. 7,211,819.

(51) Int. Cl.
*H01L 21/336* (2006.01)

(52) U.S. Cl. ............. 438/258; 438/257; 438/393; 438/394

(58) Field of Classification Search ......... 438/257–258, 438/593
See application file for complete search history.

(56) References Cited

U.S. PATENT DOCUMENTS

| 5,789,277 | A  | * | 8/1998  | Zahorik et al. ............... 438/95 |
| 6,670,628 | B2 | * | 12/2003 | Lee et al. ...................... 257/4 |
| 6,764,894 | B2 | * | 7/2004  | Lowrey ...................... 438/238 |
| 6,818,481 | B2 | * | 11/2004 | Moore et al. ............... 438/130 |
| 7,314,776 | B2 | * | 1/2008  | Johnson et al. ............. 438/95 |
| 2003/0035315 | A1 | * | 2/2003 | Kozicki ...................... 365/171 |

* cited by examiner

*Primary Examiner*—Dung A. Le
(74) *Attorney, Agent, or Firm*—Trop, Pruner & Hu, P.C.

(57) ABSTRACT

A phase change device may be formed by forming a phase change material and an electrode in a pore in an insulator. The phase change material fills less of the pore than the electrode.

10 Claims, 4 Drawing Sheets

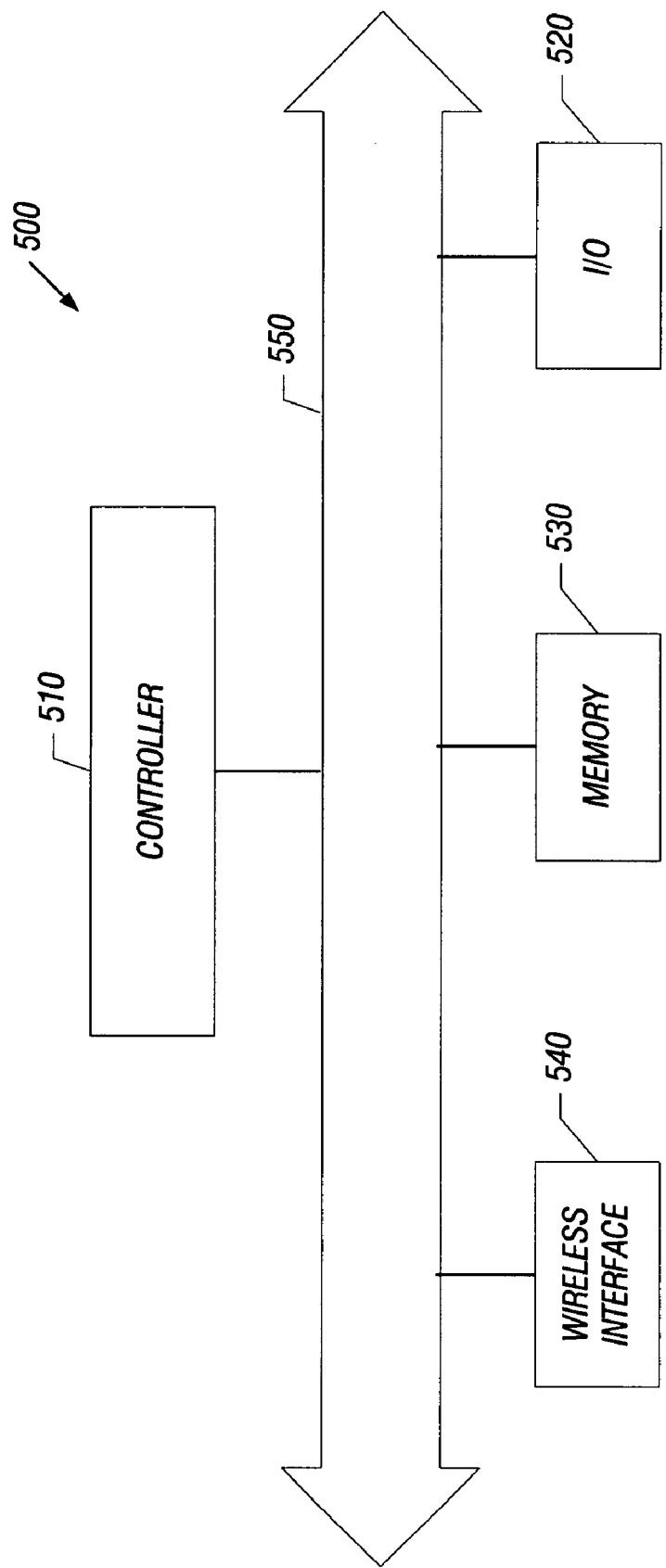

METHOD FOR FORMING A PHASE CHANGE DEVICE

CROSS-REFERENCE TO RELATED APPLICATIONS

This application is a divisional of U.S. patent application Ser. No. 10/634,139, now U.S. Pat. No. 7,211,819 filed Aug. 4, 2003.

BACKGROUND

This invention relates generally to phase change memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between the different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the program value represents a phase or physical state of the memory (e.g., crystalline or amorphous).

Thus, there is a need for better ways to form phase change memories.

BRIEF DESCRIPTION OF THE DRAWINGS

FIG. 8 is a schematic system depiction in accordance with one embodiment of the present invention.

DETAILED DESCRIPTION

Figure 1:
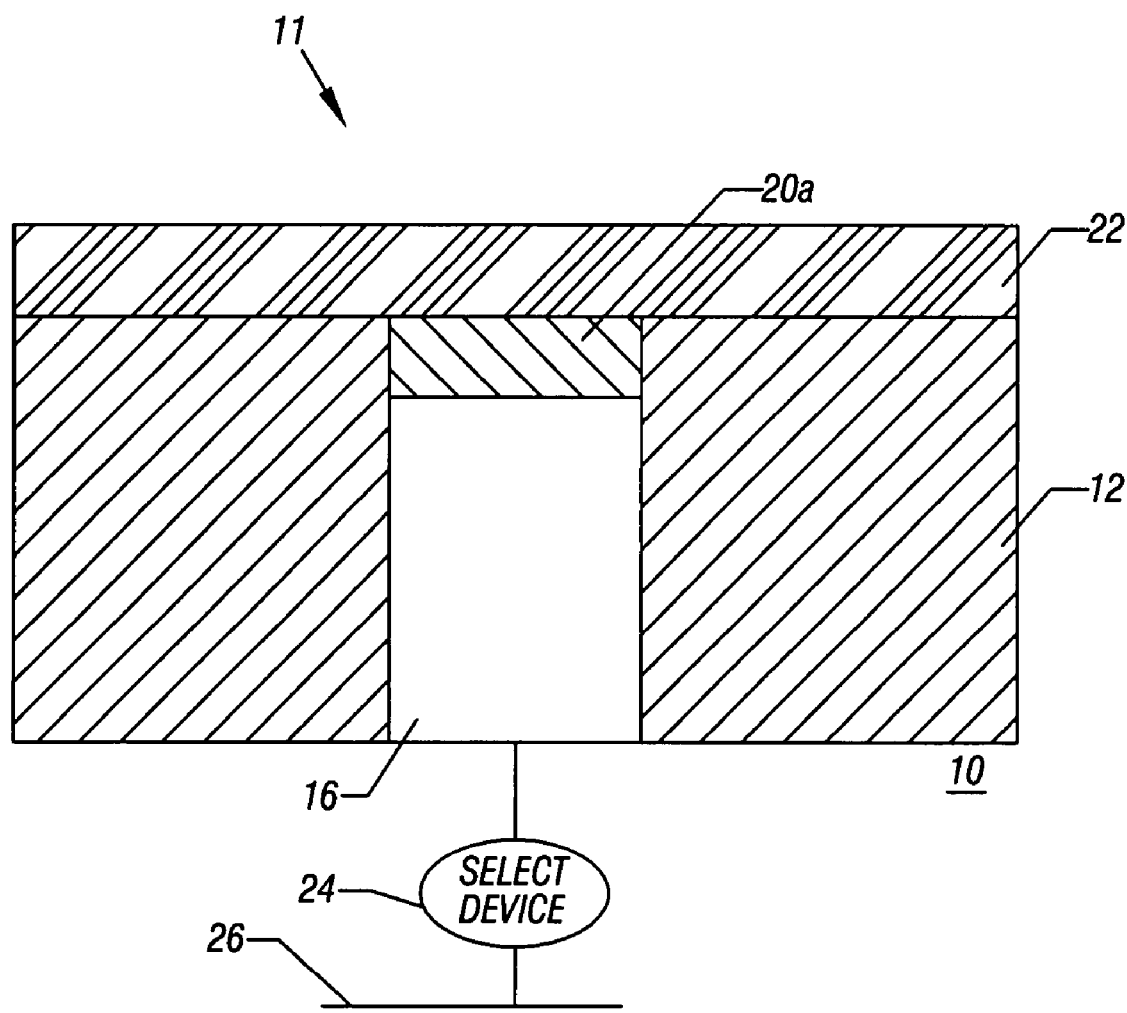
FIG. 1 is a partially schematic depiction of one embodiment of the present invention.

Referring to FIG. 1, a phase change memory 11 may have a select device 24 that selects the phase change memory by coupling the memory to a conductive line 26 that in one embodiment may be a row line. The select device 24 may be a diode or a transistor, as two examples. Another conductive line 22 is positioned over the phase change memory device. A conductive line 22 may be a column line in one embodiment of the present invention. However, it should be understood that the designations of rows and columns are generally arbitrary.

In general, the structure depicted in FIG. 1 is a cell of a phase change memory 11 that may include a large number of similarly situated cells addressable on rows and columns.

In one embodiment of the present invention, the select device 24 and the line 26 may be formed in a semiconductor substrate 10. A layer of insulating material 12 is positioned over the substrate 10. A conductive electrode 16 may form a heater that extends through a pore defined in the insulating layer 12. In one embodiment of the present invention, the electrode 16 takes up more of the available vertical extent of pore than does the phase change material 20a. The material 20a of one cell may be isolated from the phase change material of other cells.

In one embodiment, the phase change material 20a may be a non-volatile, phase change material. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material may be chalcogenide element composition from the class of tellurium-germanium-antimony ($Te_xGe_ySb_z$) material or a GeSbTe alloy, although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to one of at least two resistance values within a range of resistance values to provide single bit or multi-bit storage of information.

Programming of the memory material to alter the state or phase of the material may be accomplished by applying voltage potentials to the lines 22 and 26, thereby generating a voltage potential across the memory material 20a. An electrical current may flow through a portion of the memory material 20a and for the electrode 16 in response to the applied voltage potentials, and may result in heating of the memory material 20a.

This heating and subsequent cooling may alter the memory state or phase of the memory material 20a. Altering the phase or state of the memory material 20a may alter an electrical characteristic of the memory material 20a. For example, resistance of the material 20a may be altered by altering the phase of the memory material 20a. The memory material may also be referred to as a programmable resistive material or simply a programmable material.

In one embodiment, a voltage potential difference of about 3 volts may be applied across a portion of the memory material by applying about 3 volts to a lower line 26 and about zero volts to an upper line 26. A current flowing through the memory material 20a in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature to amorphisize memory material and "reset" memory material (e.g., program memory material to a logic "0" value). Heating the volume or memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

The information stored in memory material 20a may be read by measuring the resistance of the memory material. As an example, a read current may be provided to the memory material using opposed lines 22, 26 and a resulting read voltage across the memory material may be compared against a reference voltage using, for example, a sense amplifier (not shown). The read voltage may be proportional to the resistance exhibited by the memory storage element. Thus, a higher voltage may indicate that memory material is in a relatively higher resistance state, e.g., a "reset" state. A lower voltage may indicate that the memory material is in a relatively lower resistance state, e.g., a "set" state.

Figure 2:
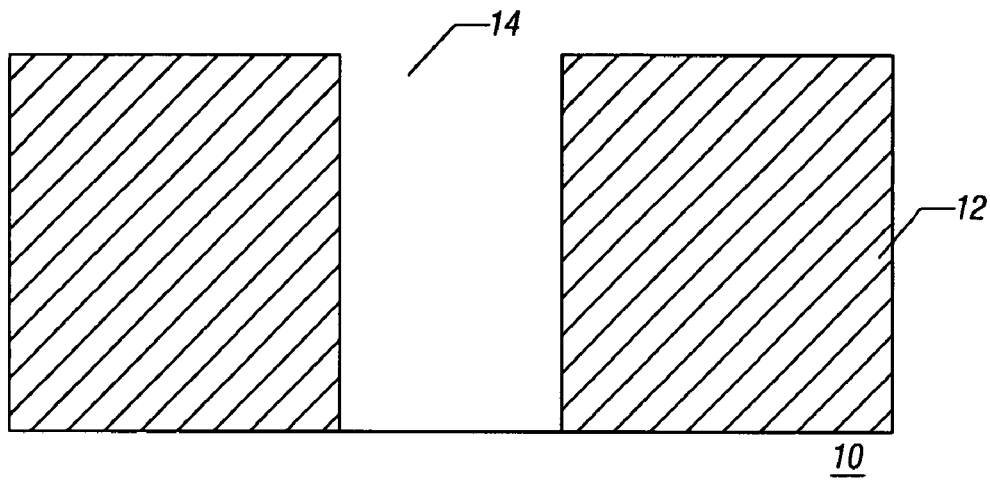
FIG. 2 is an enlarged, cross-sectional view at an early stage of manufacture in accordance with one embodiment of the present invention.
Figure 3:
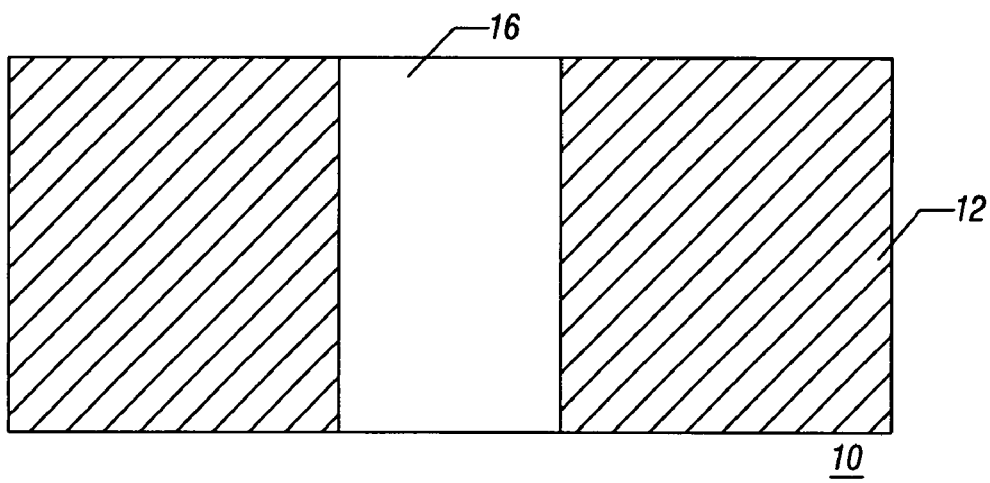
FIG. 3 is an enlarged, cross-sectional view at a subsequent stage of manufacture in accordance with one embodiment of the present invention.

Referring to FIG. 2, a damascene process may be utilized to form the phase change memory in accordance with one embodiment of the present invention. A damascene process is an integrated circuit process by which a pattern is embedded in a dielectric film on a substrate. Initially, over a substrate 10 that may define a select device 24 and a conductor 26, an insulator 12 may be defined. A pore or aperture 14 may be formed through the insulating layer 12, for example, using conventional masking and etching techniques.

The aperture 14 may then be filled with a suitable electrode 16. The electrode 16 may be any of a variety of materials utilized for electrodes or heaters for phase change memories, such as metallic materials including tungsten, titanium nitride, and titanium silicon nitride. Any metal can be used, but for heating more resistive metals may be used. Suitable materials in some embodiments may include materials that have high resistivity and low thermal conductivity. The material 16 may be deposited into the aperture 14 and then the structure may be polished to planarize the structure in some embodiments of the present invention.

Figure 4:
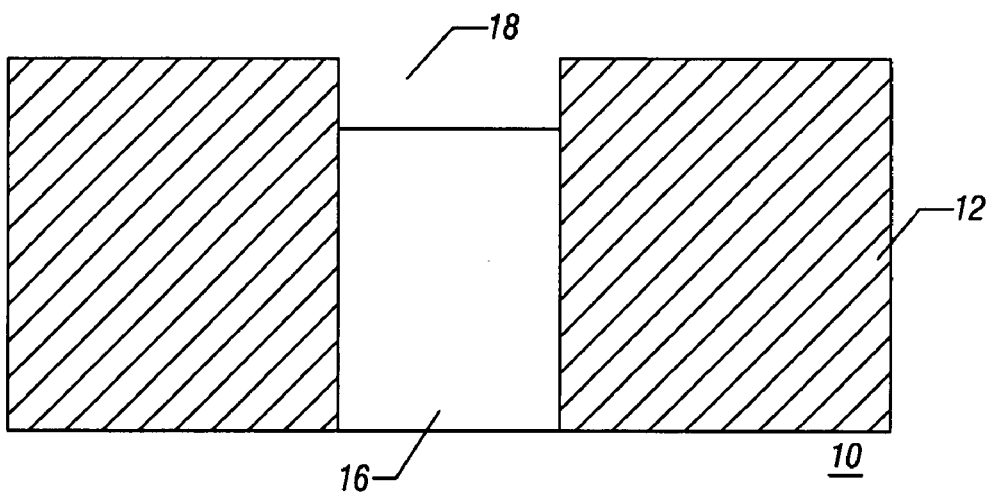
FIG. 4 is an enlarged, cross-sectional view at a subsequent stage of manufacture in accordance with one embodiment of the present invention.

Next, the recess 18 may be formed by dry or wet etching as indicated in FIG. 4. For example, a dilute acid etchant is highly selective of metal (e.g., the electrode 16) over oxide (e.g., the insulator 12). For example, 60 to 80 percent sulfuric acid may be used with hydrogen peroxide and water. An another example, ammonia hydroxide may be used.

Figure 5:
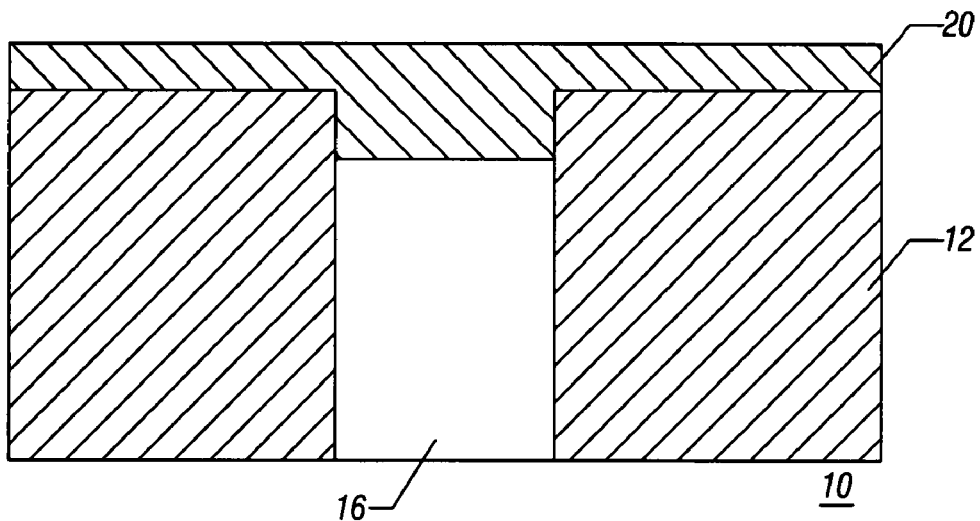
FIG. 5 is an enlarged, cross-sectional view at still a subsequent stage of manufacture in accordance with one embodiment of the present invention.

As shown in FIG. 5, a layer of phase change material 20 may be deposited over the insulator 12 and filling the recess 18 in one embodiment of the present invention. As a result, in the stage shown in FIG. 5, the phase change material 20 has a T-shaped configuration.

Figure 6:
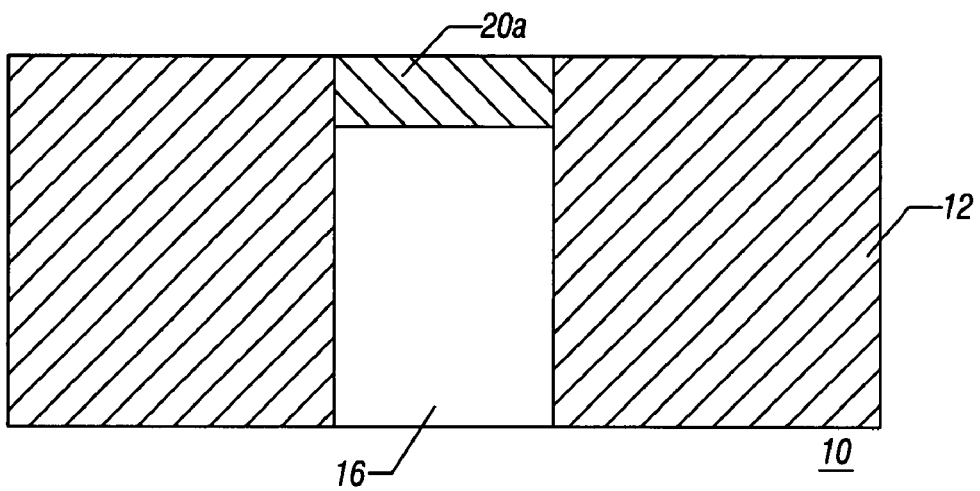
FIG. 6 is an enlarged, cross-sectional view at a subsequent stage of manufacture in accordance with one embodiment of the present invention.
Figure 7:
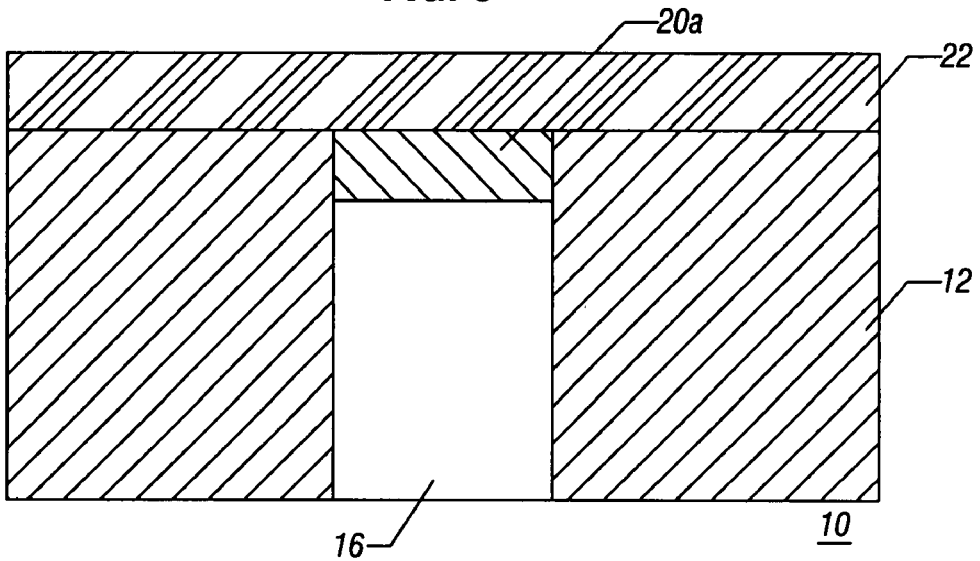
FIG. 7 is an enlarged, cross-sectional view at a subsequent stage of one embodiment of the present invention.

Turning next to FIG. 6, a portion of the phase change material 20 overlying the insulator 12 may then be removed by polishing, planarizing, or dry etching, to mention a few examples. As a result, a relatively small amount of phase change material 20a may be left by the damascene process in the region defined by the recess 18.

In some embodiments of the present invention, the phase change material 20a may constitute less than half the vertical extent of the heater 16. In one embodiment of the present invention, the phase change material 20a may constitute less than 25 percent of the overall vertical extent of the insulator 12. In another embodiment, the phase change material 20a may constitute about 10 percent or less of the vertical extent of the insulator 12.

Thereafter, an upper electrode 22 may be defined using suitable metal deposition techniques or any other technique well known to those skilled in the art.

In accordance with some embodiments of the present invention, the resulting cell involves phase change material that is confined to a relatively small volume of a pore. The phase change material may be encapsulated and isolated from the rest of the circuitry. In addition, in some embodiments, the phase change material is not part of the bitline. This reduces the need for an adhesion layer and reduces the amount of phase change material on the wafer surface in some embodiments. In addition, in some embodiments, all the volume of the phase change material is switched from one state to the other. Therefore, the bit set resistance becomes saturated to a value independent of the programming current in the prior reset condition. This property may provide a reduced variation of set resistance across the bits. In addition, in some embodiments, current flows between two substantially parallel plate electrodes providing uniform current density.

Turning to FIG. 8, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise a volatile memory (any type of random access memory), a non-volatile memory such as a flash memory, and/or phase change memory that includes a memory element such as, for example, memory element 11 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a pore in an insulator;
   forming an electrode in said pore; and
   forming a phase change material over said electrode, such that said phase change material fills less of said pore than the electrode, said electrode to heat said phase change material and to cause said phase change material to change phase between amorphous and crystalline phases.

2. The method of claim 1 including forming the phase change material so that the phase change material fills less than 25 percent of the pore.

3. The method of claim 2 including forming the phase change material so that the phase change material fills about 10 percent or less of the pore.

4. The method of claim 1 including forming a chalcogenide phase change material.

5. The method of claim 1 including forming an electrode that acts as a heater for said phase change material.

6. The method of claim 1 including forming the pore in the insulator, and filling the pore with material to form the electrode.

7. The method of claim 6 including etching a portion of the electrode material from the pore.

8. The method of claim 7 including using an etchant that is highly selective to the material of the electrode relative to the material of the insulator.

9. The method of claim 1 including filling said pore with a material to form said electrode and then planarizing the insulator and electrode material.

10. The method of claim 1 including coupling said electrode to a select device.

* * * * *